United States Patent
Tinsley et al.

(10) Patent No.: US 6,621,308 B2
(45) Date of Patent: Sep. 16, 2003

(54) SUPPLY VOLTAGE COMPENSATION CIRCUIT FOR HIGH SPEED LVDS PREDRIVE

(75) Inventors: Steven J. Tinsley, Garland, TX (US); Hector Torres, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/865,630

(22) Filed: May 25, 2001

(65) Prior Publication Data

US 2002/0180506 A1 Dec. 5, 2002

(51) Int. Cl.[7] .................................................. H03K 3/00
(52) U.S. Cl. ........................ 327/108; 327/333; 327/538; 327/540
(58) Field of Search ........................ 327/333, 362, 327/538, 540, 108; 326/80, 81, 82, 83, 84, 63, 75

(56) References Cited

U.S. PATENT DOCUMENTS 4,694,201 A * 9/1987 Jason ........................... 326/68
5,367,247 A * 11/1994 Blocher et al. .............. 323/222

* cited by examiner

Primary Examiner—My-Trang Nu Ton
Assistant Examiner—Hiep Nguyen
(74) Attorney, Agent, or Firm—W. Daniel Swayze, Jr.; W. James Brady; Frederick J. Telecky, Jr.

(57) ABSTRACT

A circuit that provides a stable predrive to a BiCMOS LVDS output which compensates for supply voltage variations while maintaining a suitably fast signal path. The supply voltage compensation circuit provides an offset to the predrive level shift such that when the supply voltage $V_{cc}$ rises, the predrive output voltage is lowered in response.

12 Claims, 4 Drawing Sheets

SUPPLY VOLTAGE COMPENSATION CIRCUIT FOR HIGH SPEED LVDS PREDRIVE

BACKGROUND OF THE INVENTION

1. Field of the Invention

This invention relates generally to low voltage differential signaling, and more particularly to a circuit that provides a stable predrive to a BiCMOS low voltage differential signaling (LVDS) output which compensates for supply voltage variations while maintaining a suitably fast signal path.

2. Description of the Prior Art

Low voltage differential signaling (LVDS) transceiver products directed to high speed LVDS repeater types and PECL/ECL to LVDS converter types are continuously being developed and improved. These transceiver products are meant to receive a differential input signal and drive a TIA/EIA-644 compliant LVDS signal. One of the most significant technical problems associated with a high speed repeater (up to 1.36 GBps) is meeting the extremely low total jitter requirements necessary for transmission of such fast signals. For this reason, the signal paths of all high speed LVDS repeaters are fully balanced differential types. High speed BiCMOS processes are uniquely suited to such circuits due to the availability of very high speed NPN transistors; and such transistors are employed liberally in the signal paths of many LVDS repeaters. NPN devices must be driven in a narrow range of input voltage values to avoid entering the cutoff or saturation regions of operation. For this reason, difficult problems often arise in the DC biasing of NPN signal paths, especially given a range of supply voltage and temperature conditions over which all parametrics are specified.

In view of the foregoing, it would be desirable to have a circuit that provides a stable predrive to a BiCMOS LVDS output which compensates for supply voltage variations while maintaining a suitably fast signal path.

SUMMARY OF THE INVENTION

The present invention is directed to a circuit that provides a stable predrive to a BiCMOS LVDS output which compensates for supply voltage variations while maintaining a suitably fast signal path.

According to one aspect of the invention, a predrive supply voltage compensation circuit comprises:

a predrive supply voltage;

a predrive input stage responsive to a first bias current and operative to process a differential input signal and generate a first differential output signal therefrom;

a first level shifter stage responsive to the first bias current and operative to level shift the first differential output signal downward to generate a second differential output signal therefrom;

a differential gain stage responsive to the first bias current and operative to process the second differential output signal to generate a third differential output signal therefrom;

a second level shifter stage connected to a pair of predrive output nodes and responsive to a second bias current to level shift the third differential output signal downward as the predrive supply voltage increases to generate a predrive output signal at the pair of predrive output nodes; and a bias current supply circuit configured to generate the second bias current such that the second bias current is proportional to the square of the predrive supply voltage.

According to another aspect of the invention, a predrive supply voltage compensation circuit comprises:

a predrive supply voltage; and a bias current supply circuit configured to generate a predrive bias current that is proportional to the square of the predrive supply voltage and that is operational to cause a predrive to shift an output signal downward as the predrive supply voltage increases.

According to yet another aspect of the invention, a predrive supply voltage compensation circuit comprises:

a predrive supply voltage; and means for generating a predrive bias current that is proportional to the square of the predrive supply voltage and capable of causing a predrive to shift an output signal downward in response to the predrive bias current as the predrive supply voltage increases.

According to still another aspect of the invention, a method of compensating predrive supply voltage changes comprises the steps of:

providing a predrive supply voltage and a means for generating a predrive bias current that is proportional to the square of the predrive supply voltage; and causing a low voltage differential signaling predrive to shift a predrive output signal downward in response to the predrive bias current as the predrive supply voltage increases.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
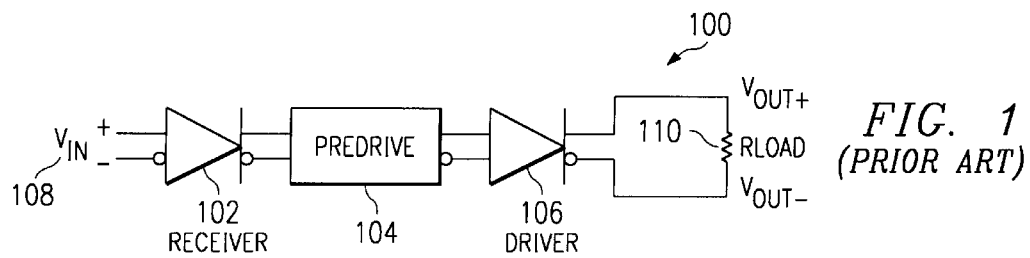
FIG. 1 is a block diagram that illustrates a common fully differential LVDS repeater.

FIG. 1 is a block diagram that illustrates a common fully differential LVDS repeater 100. The receiver 102 senses the input signal and drives a predrive circuit 104, which in turn drives the driver 106. A differential input voltage 108 is translated to a differential output voltage across a resistive load 110.

Figure 2:
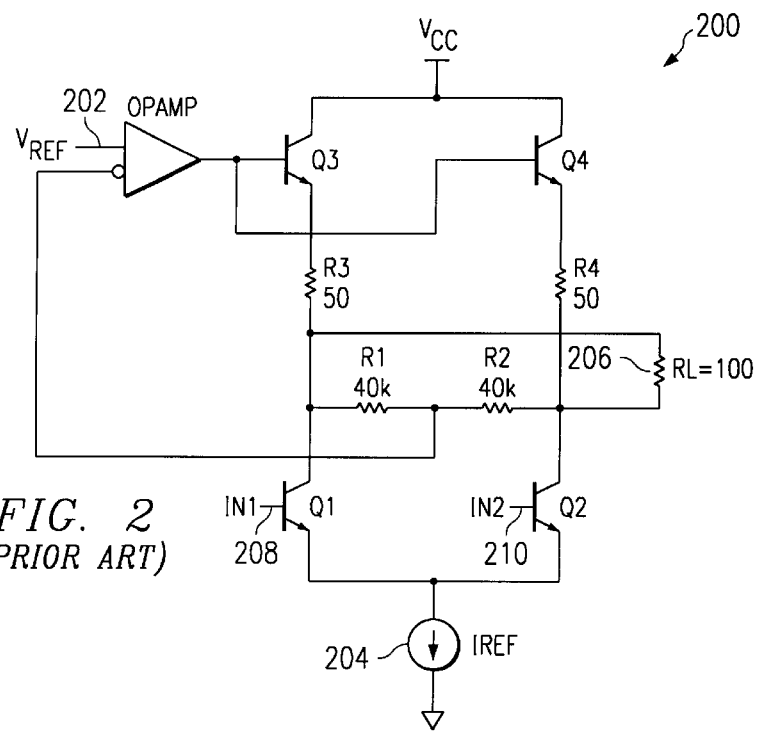
FIG. 2 is a schematic diagram that illustrates a prior art driver circuit in a modern BiCMOS process for the fully differential LVDS repeater shown in FIG. 1.

FIG. 2 is a schematic diagram that illustrates a prior art driver circuit 200 in a modern BiCMOS process for the fully differential LVDS repeater 100 shown in FIG. 1. In this circuit 200, Q1 and Q2 are the drive transistors. Q3 and Q4 are configured as voltage regulators to provide the requisite high level voltage, and to regulate the common mode function of R1 and R2) to the reference voltage set by $V_{ref}$ 202. The bias current $I_{ref}$ 204 sets the current such that the differential voltage switched across the load resistor $R_L$ 206 is correct. In order for this driver circuit 200 to function properly, the voltages at in1 (208) and in2 (210) must be driven to levels which do not allow Q1 or Q2 to saturate at any point, and which do not run these devices into cutoff. In other words, for proper operation, Q1 and Q2 must be biased in the forward active region under all conditions. Because of the low common mode output requirements for TIA/EIA644 compliant LVDS drivers (1.2±0.1V), the range of input voltages capable of driving Q1 and Q2 is quite small.

Figure 3:
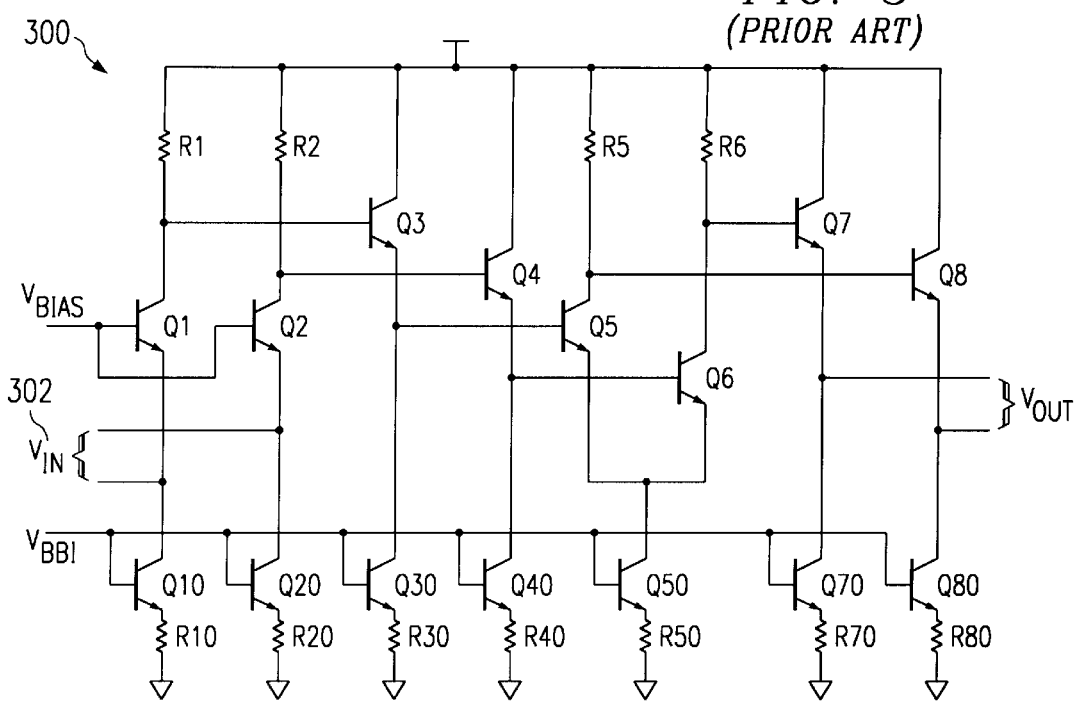
FIG. 3 is a schematic diagram illustrating a prior art LVDS predrive circuit in a modern BiCMOS process for the fully differential LVDS repeater shown in FIG. 1.

FIG. 3 is a schematic diagram illustrating a prior art LVDS predrive circuit 300 in a modern BiCMOS process for the fully differential LVDS repeater 100 shown in FIG. 1. Input voltage $V_{in}$ 302, according to one embodiment, comes from the output of a folded cascode type receiver, with Q1/Q2, Q10/Q20 and R1/R2 comprising the folded cascode output. The signal bias at the input of Q3/Q4 is quite high due to the passive pullup resistors R1 and R2 which are sized small to maximize the speed of the Q1/Q2 gain stage. Transistors Q3 and Q4 are therefore used to level shift the signal down to the input of the differential gain stage comprising Q5 and Q6. By loading the Q5/Q6 differential pair resistively, and biasing at the maximum frequency current density for these devices, the differential gain stage can be made extremely fast. Transistors Q7 and Q8 operate to perform the final level shift function necessary to drop the signal voltage down to the predrive levels of Q1 and Q2 shown in FIG. 2.

Although the predrive circuit 300 illustrated in FIG. 3 is very fast, there are DC biasing issues which must be addressed to ensure that the predrive signal to the driver 200 stays between the cutoff and saturation voltages of the output drive transistors Q1/Q2 discussed herein before with reference to FIG. 2. Because the voltages at the base of Q7 and Q8 are tied resistively to the positive supply rail, the input to the Q7/Q8 level shifters changes with the supply voltage; and since the output of the Q7/Q8 level shifters is proportional to their input, the predrive signal is also linearly dependent on the supply voltage $V_{cc}$. Further, the amount of level shift applied is dependent on temperature, due to the temperature dependence of the base-emitter voltage $V_{be}$ of a bipolar transistor. For these reasons, the predrive level can change significantly with supply voltage and temperature variations, sending the driver transistors Q1/Q2 into saturation under certain conditions. In practice, the high supply voltage condition is most likely to cause the predrive voltage to rise high enough to cause the drive transistors Q1/Q2 to saturate. This condition is most likely at low temperatures, since that is the temperature region at which the base-emitter voltage $V_{be}$ of the Q7/Q8 level shifters is lowest. Also in practice, the predrive circuit 300 can be tuned to maintain Q1 and Q2 shown in FIG. 2 between their cutoff and saturation regions under almost all conditions. A problem arises however, at the high supply voltage and low temperature corner, when the predrive to Q1 and Q2 causes the output transistors to enter saturation. At certain process corners in a real BiCMOS process, this effect can be observed at higher temperatures as well.

A solution to the saturation problems discussed above includes providing an offset to the level shift such that when the supply voltage $V_{cc}$ rises, the predrive voltage is lowered in response. A resistance can be added between the emitters of Q7/Q8 and the respective predrive nodes in the circuit 300 illustrated in FIG. 3 such that the bias current provided by Q70/Q80 is changed to one which varies with the supply voltage so that at higher supply voltages, the voltage drop from Q7/Q8 to the predrive is increased. The net effect is a canceling of the supply voltage $V_{cc}$ effect on the DC bias level of the predrive.

Figure 4:
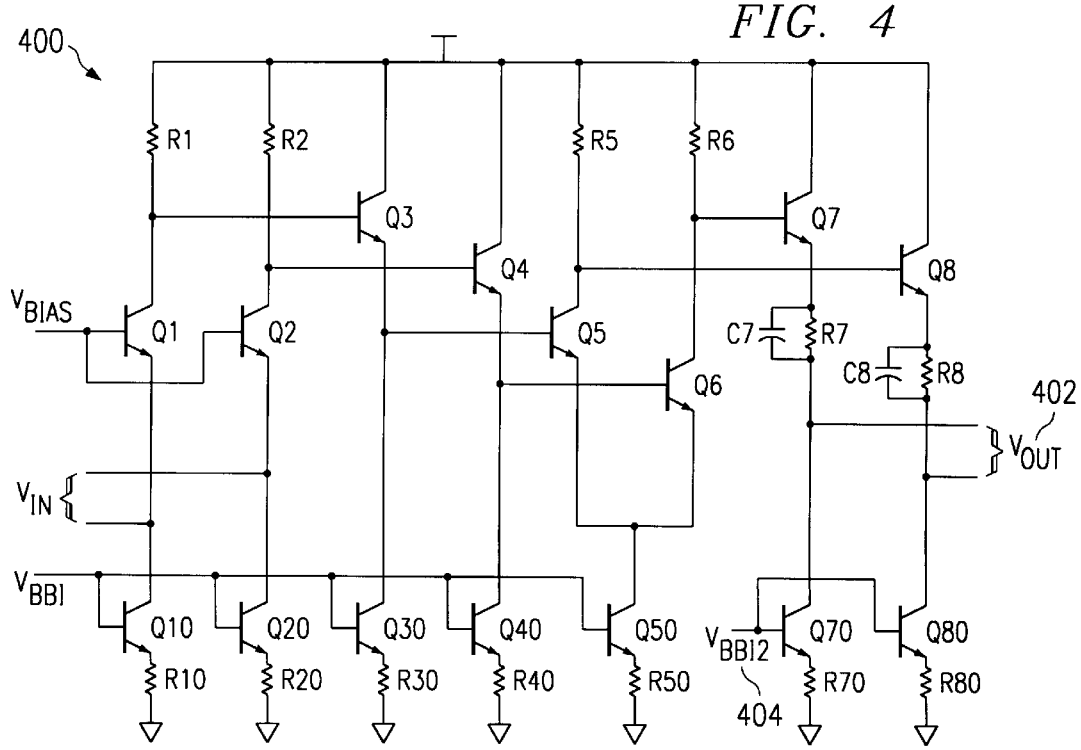
FIG. 4 is a schematic diagram illustrating an improved LVDS predrive circuit in a modern BiCMOS process for the fully differential LVDS repeater shown in FIG. 1 according to one embodiment of the present invention.

FIG. 4 is a schematic diagram illustrating an improved LVDS predrive circuit 400 in a modern BiCMOS process suitable for use with the fully differential LVDS repeater 100 shown in FIG. 1 according to one embodiment of the present invention. The predrive circuit 400 provides a separate bias current to Q7/Q8, and the resistors R7 and R8 to drop the predrive voltage as described herein before. The predrive level ($V_{out}$) 402 is based on a $V_{be}$ drop for Q7 and Q8, which is related to the collector current by the relationship $V_{be} = V_t * \ln(I_c/I_s)$. Because of this nonlinear relationship, the bias current supplied by $V_{bbi2}$ 404 must be more than linearly dependent on changes in the supply voltage $V_{cc}$. With a simple current source which is linearly proportional to the supply voltage, the compensation is not great enough to overcome the logarithmic dependence of $V_{be}$. One solution to this problem can be implemented by using a current squaring circuit, so that the current supplied by Q70 and Q80 is proportional to the square of the supply voltage $V_{cc}$. In this way, variations in supply voltage are met with square law variations in the bias current at Q70 and Q80. Such an approach is problematic however, since a degradation in speed is caused by the resistors R7 and R8. This degradation can be eliminated using bypass capacitors such as C7 and C8 to provide a high frequency bypass for improved high frequency performance.

Figure 5:
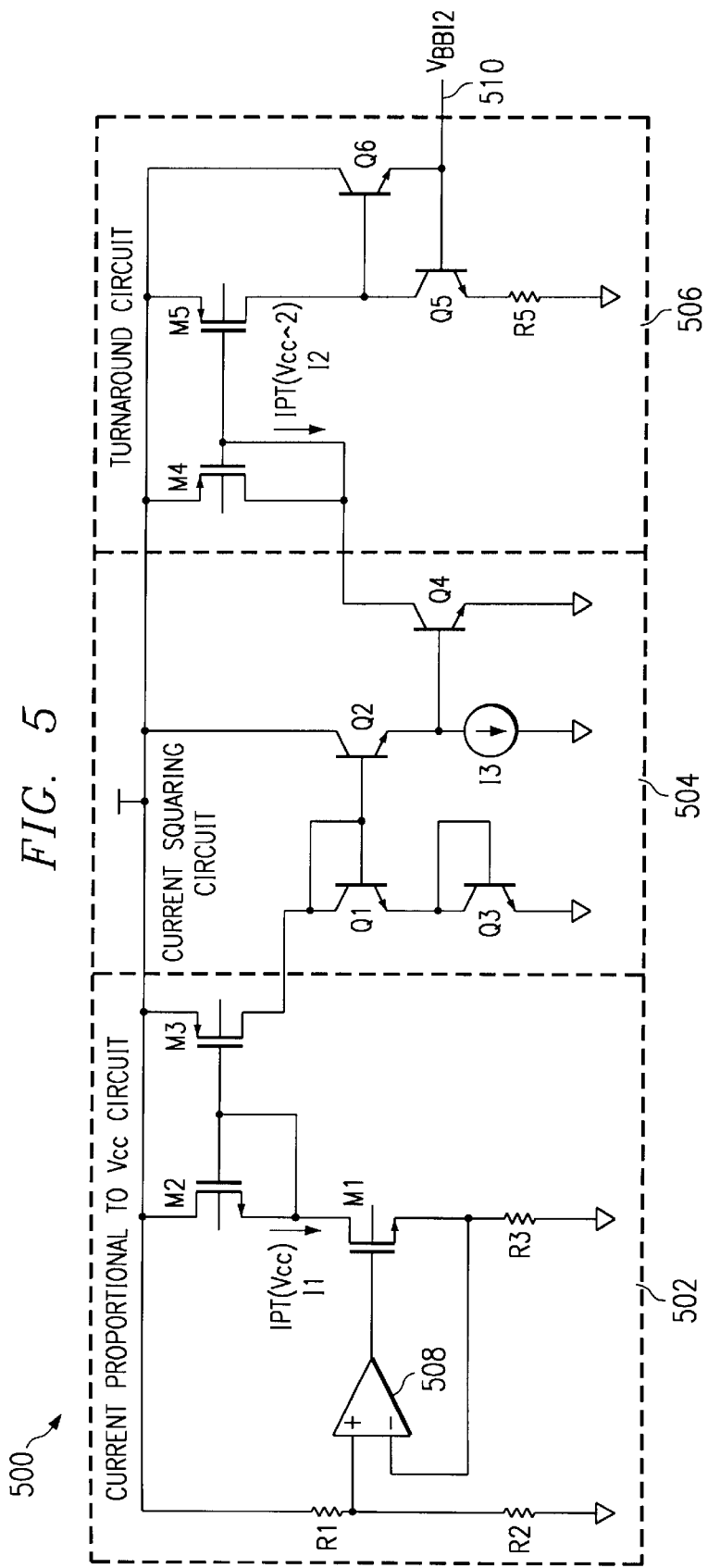
FIG. 5 is a schematic diagram illustrating a current proportional to $(V_{cc})^2$ circuit suitable to provide biasing for the improved LVDS predrive circuit shown in FIG. 4 such that variations in supply voltage are met with square law variations in bias current.

FIG. 5 is a schematic diagram illustrating a current proportional to $(V_{cc})^2$ circuit 500 suitable to provide biasing currents for Q70 and Q80 of the improved LVDS predrive circuit 400 shown in FIG. 4 such that variations in supply voltage are met with square law variations in bias current. The current proportional to $(V_{cc})^2$ circuit 500 includes three sections: a circuit 502 to provide a current proportional to the supply voltage $V_{cc}$, a circuit 504 to provide a current proportional to the square of the input current, and a turnaround circuit 506 to buffer the output current and put it is the same format as the receiver circuit bias. The current proportional to $V_{cc}$ circuit 502 is extremely straightforward. A voltage proportional to $V_{cc}$ is provided by the R1/R2 voltage divider to the input of a buffer 508. Transistor M1 provides a low impedance node at resistor R3 and maintains the input voltage at the junction of R1 and R2 at the source of M1. The current through M1 is, therefore, the voltage provided at the positive input to the opamp 508 divided by the resistance of R3. Since the voltage at R3 is proportional to $V_{cc}$, the current is also proportional to $V_{cc}$. This current proportional to $V_{cc}$ (IPTV$_{cc}$) is mirrored by M2 and M3 to the input of the current squaring circuit 504.

Figure 6:
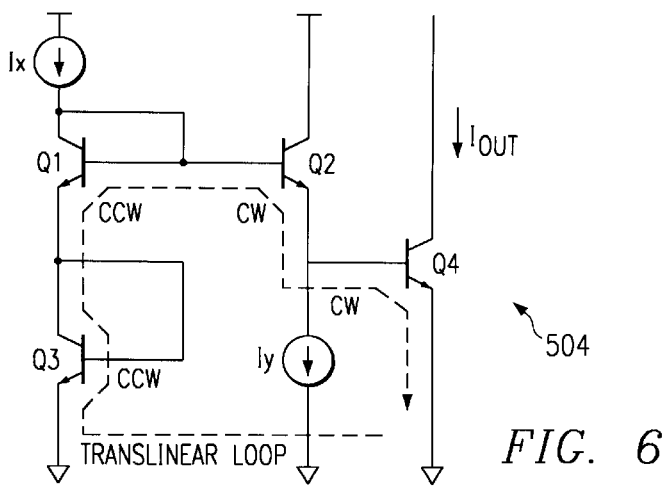
FIG. 6 is a schematic diagram illustrating the current squaring circuit portion of the current proportional to $(V_{cc})^2$ circuit shown in FIG. 5.

FIG. 6 is a schematic diagram illustrating the current squaring circuit 504 portion of the current proportional to $(V_{cc})^2$ circuit 500 shown in FIG. 5. The current squaring circuit demonstrates one application of the translinear principal. The translinear principle states that in a closed loop of forward biased PN junctions (typically the base-emitter junction of an NPN transistor) with an even number of clockwise biased junctions and counter clockwise biased junctions, the product of the current densities in the clockwise direction is equal to the product of the current densities in the counterclockwise direction, which can be mathematically stated as $$\prod_{CW} J_C = \prod_{CCW} J_C.$$

By inspection of circuit 504 in FIG. 6 (ignoring base currents), (1) $I_c(Q1)=I_x$ and (2) $I_c(Q3)=I_c(Q1)$. Also by inspection, (3) $I_c(Q2)=I_y$ and (4) $I_{out}=I_c(Q4)$. By the translinear principle . . . $I_c(Q1)^* I_c(Q3)=I_c(Q2)^* I_c(Q4)$. Since, according to equations (1) and (2), $I_c(Q1)$ and $I_c(Q3)$ both equal $I_x$, then (5) $(I_x)^2=I_c(Q2) \cdot I_c(Q4)$. Plugging equation (3) into equation (5) then yields (6) $(I_x)^2=I_c(Q2) \cdot I_y$. Plugging equation (4) into equation (6) and rearranging to solve for $I_{out}$, finally provides $$I_{out} = \frac{(I_x)^2}{I_y}.$$

This then provides an output current that is proportional to the square of the input current. Since the input to the current squaring circuit 504 is the IPTV$_{cc}$, the output current I(Q2) is proportional to the square of $V_{cc}$ (IPTV$_{cc}^2$).

Looking again at FIG. 5, transistors M4 and M5 in the turnaround circuit 506 are used to mirror the current around into the Q5/Q6/R5 circuit. Transistor Q5 and resistor R5 comprise a current mirror that provides the bias node $V_{bbi2}$ 510 to the current source in FIG. 4. Resistor R5 is a degeneration resistor used to improve matching in bipolar current sources, and transistor Q6 is a base current cancellation device commonly used to improve the DC performance of bipolar current mirrors. Using the Q5/Q6/R5 circuit, the IPTV$_{cc}^2$ current is provided to the predrive circuit 400 in the same format as the rest of the bias currents.

Figure 7:
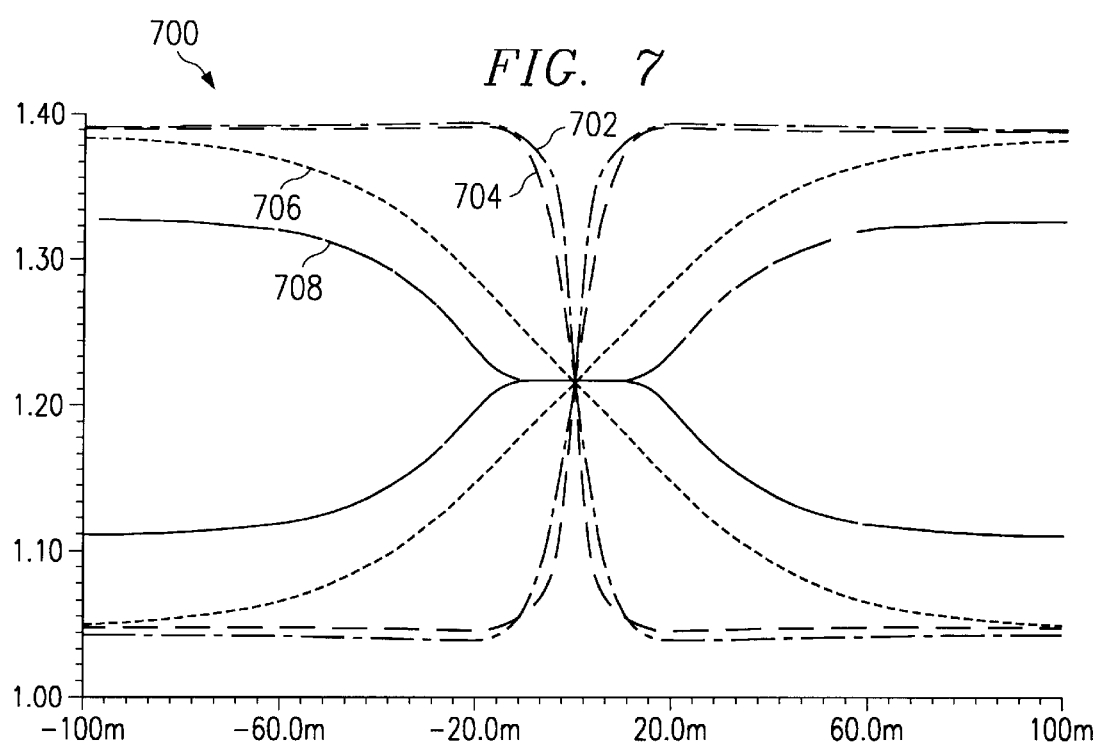
FIG. 7 is a DC response diagram for the LVDS predrive circuit shown in FIG. 3.

FIG. 7 is a DC response diagram 700 for the LVDS predrive circuit 300 shown in FIG. 3. In this diagram 700, the X-axis represents the differential input voltage, and the Y-axis represents the voltage at the outputs. In the embodiments set forth herein above, the driver 106 maintains the 1.2V common mode required by the TIA/EIA644 specification discussed herein before. The four waveforms set forth in FIG. 7 are the high and low outputs at the four corners of high and low supply voltage (3.0V and 3.6V) and temperature (−40° C. and 85° C.). Both the high and low outputs are shown for all four corners of high and low supply voltage and high and low temperature. Specifically, Waveform 702 corresponds with a supply voltage of 3.0V and a temperature of −40° C. Waveform 704 corresponds with a supply voltage of 3.0V and a temperature of 85° C. Waveform 706 corresponds with a supply voltage of 3.6V and a temperature of 85° C. Waveform 708 corresponds with a supply voltage of 3.6V and temperature of 0° C. The outer waveforms 702, 704 represent the circuit response at low supply voltage, and are the type of waveforms that are desired. The output is the proper DC differential voltage, with a small linear amplification region in the crossover at less than 20 mV of differential voltage. The inner waveforms 706, 708 represent the circuit performance at high supply voltage $V_{cc}$, and indicate a problem. The linear amplification region associated with outer waveforms for both temperature cases is quite large, with the low temperature waveform 708 containing a large dead zone at the crossover point.

Figure 8:
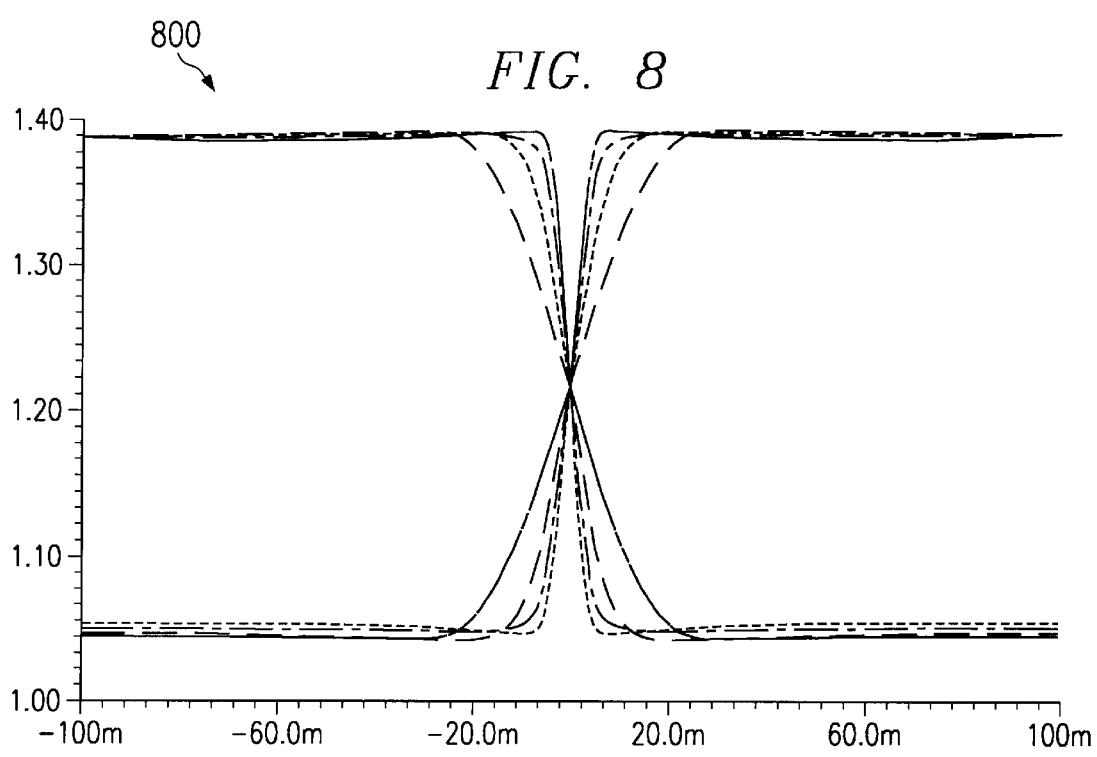
FIG. 8 is a DC response diagram for the LVDS predrive circuit shown in FIGS. 4–6.

FIG. 8 is a DC response diagram 800 for the LVDS predrive circuit 400 shown in FIG. 4. It can be easily seen that the circuit 400 performance is desirable for all combinations of the specified extremes of supply voltage and temperature. There is a small linear amplification region that is always below the specified switching threshold of 50 mV.

The present high speed LVDS predrive circuit and associated supply voltage compensation circuit then, represents a significant advancement in the art of BiCMOS LVDS predrive technology. This invention has been described in considerable detail in order to provide those skilled in the high speed differential repeater art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A predrive circuit comprising:
   a predrive supply voltage;
   a predrive input stage responsive to a first bias current and operative to process a differential input signal and generate a first differential output signal therefrom;
   a first level shifter stage responsive to the first bias voltage and operative to level shift the first differential output signal downward to generate a second differential output signal therefrom;
   a differential gain stage responsive to the first bias voltage and operative to process the second differential output signal to generate a third differential output signal therefrom;
   a second level shifter stage connected to a pair of predrive output nodes and responsive to a second bias voltage based on a second bias current to level shift the third differential output signal downward as the predrive supply voltage increases to generate a predrive output signal at the pair of predrive output nodes; and
   a bias current supply circuit configured to generate the second bias current such that the second bias current is proportional to the square of the predrive supply voltage.

2. The predrive circuit according to claim 1 wherein the predrive input stage, the first level shifter stage, the differential gain stage and the second level shifter stage are devoid of PNP transistors.

3. The predrive circuit according to claim 1 wherein each predrive output node is connected to the second level shifter stage via a resistor.

4. The predrive circuit according to claim 3 further comprising a bypass capacitor connected in parallel with each respective resistor.

5. The predrive circuit according to claim 1 wherein the bias current supply circuit comprises:
   a current proportion circuit configured to provide a first current proportional to the predrive supply voltage;
   a current squaring circuit configured to provide a second current proportional to the square of the first current; and
   a turnaround circuit configured to buffer and format the second current into a bias voltage for the bias current supply circuit.

6. A predrive supply voltage compensation circuit comprising:
   a predrive supply voltage; and
   a bias current supply circuit configured to generate a predrive bias current that is proportional to the square of the predrive supply voltage and that is operational to cause a predrive to decrease an output signal as the predrive supply voltage increases,
   wherein the bias current supply circuit comprises:
      a current proportion circuit configured to provide a first current proportional to the predrive supply voltage;
      a current squaring circuit configured to provide a second current proportional to the square of the first current; and
      a turnaround circuit configured to buffer and format the second current into a bias voltage for the bias current supply circuit.

7. The predrive supply voltage compensation circuit according to claim 6 further comprising:
   a plurality of current source transistors, each current source transistor having an input responsive to the bias voltage and further having an output node;
   each output node having a respective resistor connected thereto such that the predrive bias current can be caused to flow through the respective resistors in response to the bias voltage when the respective resistors are further connected to a predrive circuit to implement the predrive supply voltage compensation circuit; and
   a bypass capacitor in parallel with each respective resistor.

8. A predrive supply voltage compensation circuit comprising:
   a predrive supply voltage; and
   a bias current supply circuit configured to generate a predrive bias current that is proportional to the square of the predrive supply voltage and that is operational to cause a predrive to decrease an output signal as the predrive supply voltage increases,
   wherein the bias current supply circuit is devoid of PNP transistors.

9. A predrive supply voltage compensation circuit comprising:
   a predrive supply voltage; and
   a circuit for generating a predrive bias current that is proportional to the square of the predrive supply voltage and for decreasing an output signal in response to the predrive bias current as the predrive supply voltage increases,
   wherein the circuit for generating a predrive bias current that is proportional to the square of the predrive supply voltage comprises:
      means for generating a first current proportional to the predrive supply voltage;
      means for generating a second current proportional to the square of the first current; and
      means for buffering and formatting the second current into a bias voltage for the bias current supply circuit.

10. The predrive supply voltage compensation circuit according to claim 9 wherein the bias current supply circuit further comprises:
   a current source having an input responsive to the bias voltage and further having a plurality of output nodes;
   each output node having a respective resistor connected thereto such that the predrive bias current can be caused to flow through the respective resistors in response to the bias voltage when the respective resistors are further connected to a predrive circuit to implement the predrive supply voltage compensation circuit; and
   a bypass capacitor in parallel with each respective resistor.

11. A predrive supply voltage compensation circuit comprising:
   a predrive supply voltage; and
   a circuit for generating a predrive bias current that is proportional to the square of the predrive supply voltage and for decreasing an output signal in response to the predrive bias current as the predrive supply voltage increases,
   wherein the means for generating a predrive bias current that is proportional to the square of the predrive supply voltage is devoid of PNP transistors.

12. A method of compensating a predrive supply voltage, the method comprising the steps of:
   providing a predrive supply voltage and a circuit for generating a predrive bias current that is proportional to the square of the predrive supply voltage; and
   causing a low voltage differential signaling predrive to shift a predrive output signal downward in response to the predrive bias current as the predrive supply voltage increases,
   wherein the step of causing a low voltage differential signaling predrive to shift a predrive output signal downward in response to the predrive bias current as the predrive supply voltage increases further comprises the steps of:
      generating a first current proportional to the predrive supply voltage;
      generating a second current proportional to the square of the first current; and
      formatting the second current into a bias voltage for the means for generating a predrive bias current.

* * * * *